United States Patent [19]

Deffeyes et al.

[11] 4,333,966
[45] Jun. 8, 1982

[54] METHOD OF FORMING A CONDUCTIVE METAL PATTERN

[75] Inventors: Robert J. Deffeyes, Arlington; Harris W. Armstrong, Ft. Worth, both of Tex.

[73] Assignee: Graham Magnetics, Inc., North Richland Hills, Tex.

[21] Appl. No.: 219,943

[22] Filed: Dec. 24, 1980

Related U.S. Application Data

[62] Division of Ser. No. 62,016, Jul. 30, 1979, Pat. No. 4,289,534, which is a division of Ser. No. 793,384, May 3, 1977, Pat. No. 4,186,244.

[51] Int. Cl.³ .............................................. H05K 3/00
[52] U.S. Cl. ...................................... 427/96; 427/123; 427/125; 427/216; 427/220; 427/229; 427/256; 427/282; 427/287; 427/376.6; 427/376.7; 427/383.1; 427/383.5
[58] Field of Search ................. 427/96, 123, 125, 216, 427/220, 229, 256, 282, 287, 376.7, 376.6, 383.1, 383.5

[56] References Cited

U.S. PATENT DOCUMENTS

| | | | |
|---|---|---|---|
| 3,345,199 | 10/1967 | Fitch | 106/1.05 |
| 3,383,247 | 5/1968 | Adlhart et al. | 106/1.05 |
| 3,528,845 | 9/1970 | Donley | 106/1.05 |
| 3,694,254 | 9/1972 | Blumenthal | 428/403 |
| 3,814,696 | 6/1974 | Verdone et al. | 106/1.15 |
| 3,843,349 | 10/1974 | Ehrreich et al. | 75/0.5 BA |

*Primary Examiner*—Michael R. Lusignan
*Assistant Examiner*—Richard Bueker
*Attorney, Agent, or Firm*—Robert A. Cesari; John F. McKenna; Andrew F. Kehoe

[57] ABSTRACT

A novel silver powder composition characterized by a very low fusion, or film-forming temperature, probably assignable to the relatively small amount of oxides or other undesirable occlusions within coatings formed of the powder. The invention also relates to a new process for forming such a powder; the process is believed to involve the formation of a fatty-acid silver reaction product of the surface of the silver powder before it is subjected to fusion into a metallic coating. During fusion the decomposing reactant seems to act as a flux aiding the formation of a metal film of superior appearance and strength.

9 Claims, 13 Drawing Figures

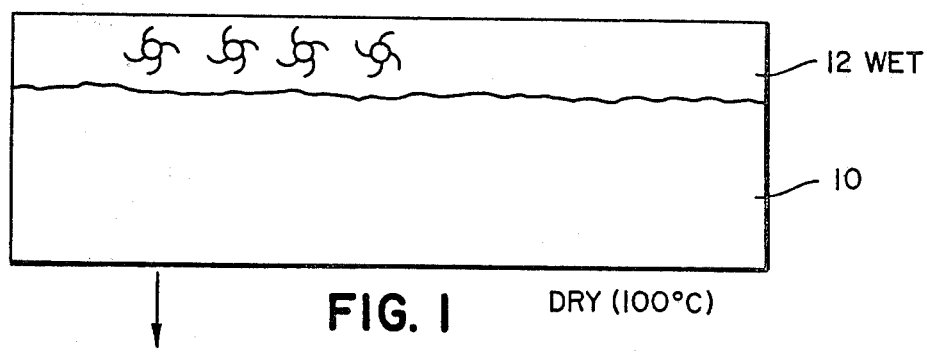
FIG. 1 DRY (100°C)
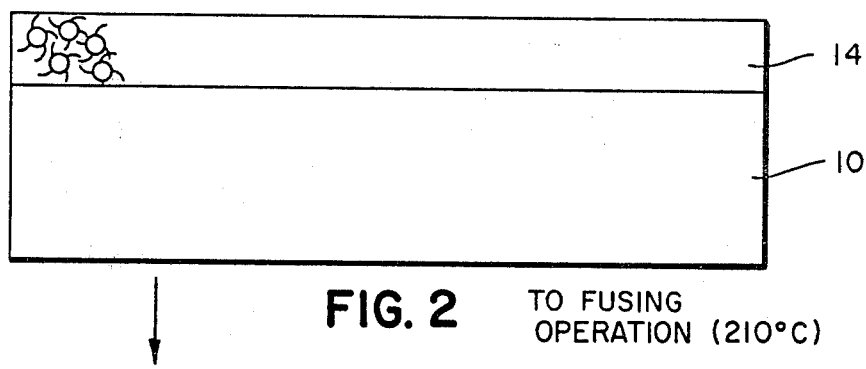
FIG. 2 TO FUSING OPERATION (210°C)
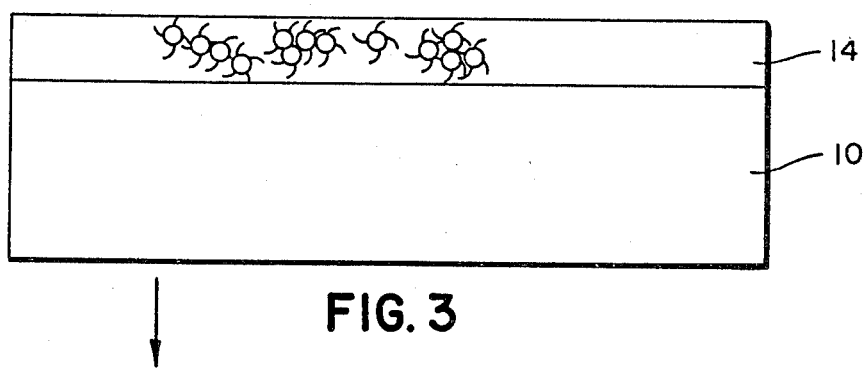
FIG. 3
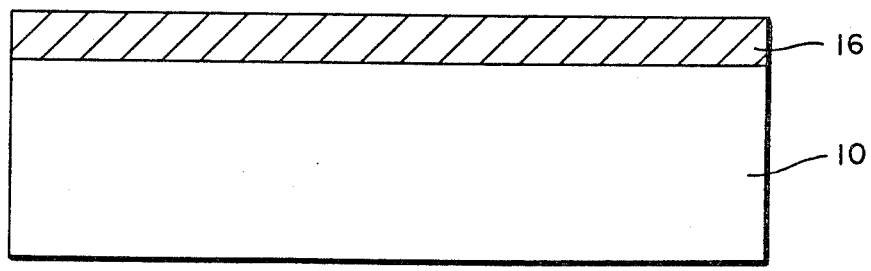
FIG. 4

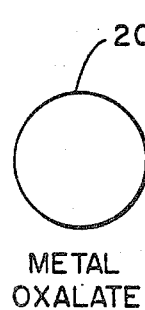
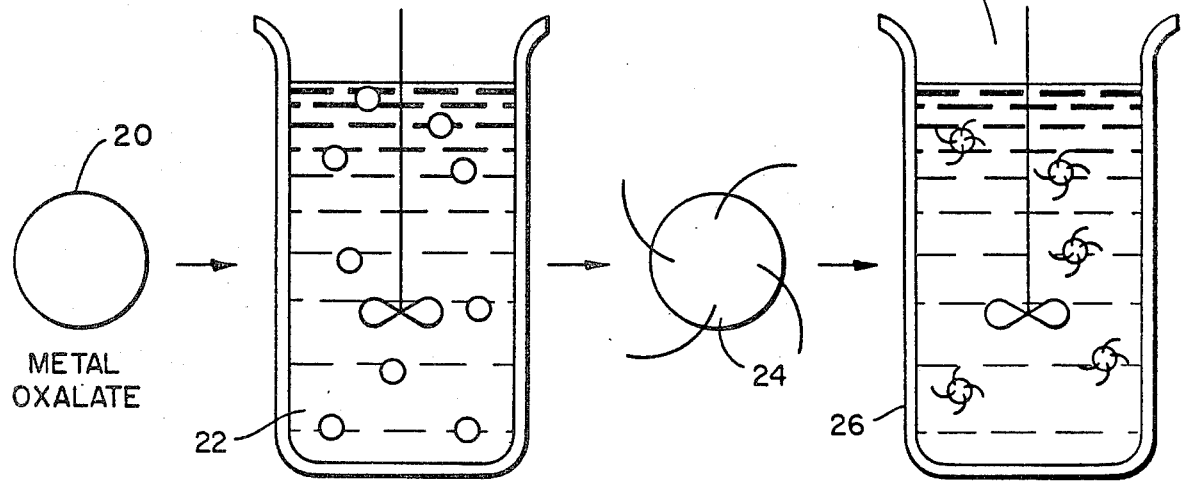
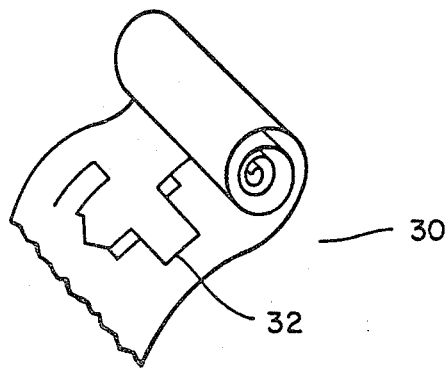

METHOD OF FORMING A CONDUCTIVE METAL PATTERN

This is a division of application Ser. No. 62,016 filed July 30, 1979, now U.S. Pat. No. 4,289,534, which is a division of Ser. No. 793,384 now U.S. Pat. No. 4,186,244.

BACKGROUND OF THE INVENTION

This invention relates to "thick films" as that term is used in the electronics industry to differentiate over ultra-thin films of the type that are formed by vacuum deposition and sputtering, etc. "Thick films" are those formed by such processes as spraying, silk screening, painting, etc.

Silver powders, like other conductive metallic powders, are often used in forming conductive masses, especially conductive coatings. There are numbers of silver powders (and compositions containing such silver powders in liquid vehicles) used in the prior art for formation of conductive coatings. Many of these materials are well known commercial products, e.g. of the type sold by the Photo Products Department of E. I. DuPont de Nemours & Co. These commercial materials are sintered at temperatures in the range of 480° C. to 950° C. in order to achieve the fusion and conductivity characteristics required by the electronics industry. Such elevated temperatures require slower processing procedures and limit the kind of materials with which the coatings can be adequately utilized. Indeed, at these temperatures, differential thermal expansion of substrate and coating often dictate the processing time cycle.

These powders of the prior art are typically of two microns or more in nominal particle size. It is believed that this particle size contributes to the inability of points formed of such powders to be formed in thin lines, i.e. lines having a resolution of less than the range of about 0.003 inches to 0.005 inches in width.

Of course, it is known that smaller particles of metals may be produced by reduction of carboxylate salts such as oxalates, formates and the like. However, it has remained a problem to obtain and utilize such powders in a highly conductive form, especially at lower temperatures.

SUMMARY OF THE INVENTION

It is an object of the present invention to provide an improved form of metal, one that may be utilized to form excellent conductive coatings at relatively low temperatures, and compositions containing said powders.

Another object of the invention is to provide an improved process for making metal-bearing powders of silver.

Another object of the invention is to provide silver coatings of excellent electrical properties and of excellent solderability.

Another object of the invention is to provide silver powders and compositions which allow improved line resolution when they are utilized in such applications as the making of hybrid circuit conductor paths known in the electrical circuitry art.

A further object of the invention is to provide less porous, i.e. more dense, conductive films.

Still another object of the invention is to provide a process for coating organic resins with high-performance silver coatings and to provide the novel products of such a process.

Another object of the invention is to provide metal coatings which can be formed as non-conductive materials and converted to conductive materials at relatively low temperature.

Another object of the invention is to provide a means to form novel metal coatings in air.

Among other objects of the invention are the provision of such processes as are required to utilize and achieve the foregoing objects.

Other objects of the invention will be obvious to those skilled in the art of their reading of this invention; they include providing products which comprise mixtures of the novel powders of the invention and high-temperature fusing powders of the prior art, wherein the sintering temperatures of the mixtures are substantially lower than those of the prior art; e.g. below 500° C.

The above objects have been substantially achieved as a result of the discovery that metal powders of the type formed from organometallic salts can be beneficially modified if, during the formation thereof, they are maintained in intimate contact with an organic reactant which acts as a means to (a) react with the metal as the metal itself is formed;
(b) to help provide a protective coating on the surface of the metal;
(c) to avoid the formation of harmful amounts of oxides, sulfides, or other refractory compounds on the surface of the newly formed metal;
(d) to limit the metal powder to a very small particle size.

Among the satisfactory organic reactants are carboxylic acids, especially acids such as oleic acid, stearic acid, linoleic acid, palmitic and the like. In general, compositions with 8 to 24 carbon atoms are most useful.

Other organic reactants which have a film protecting moiety can function like the aliphatic group of a fatty acid and can be used instead of fatty acids. Of course the reactant should be thermally decomposable at temperatures below the desired metal-film temperature.

It is believed that the process of the invention functions by providing a heat-decomposable compound, say, silver oleate on a site of the incipient metal particles where, in the absence of such a compound, an oxidized (or other refractory or non-conductive) site would be formed. It is believed to be immaterial what reactant is used as long as the desired preemptive reaction with the metal is achieved, i.e. that oxide or other undesirable compounds, are avoided. Of course, it is also necessary for the film-forming moiety to be heat decomposable at temperatures below those sintering temperatures made possible by the process of the invention.

The most advantageous embodiments of the invention are those using decomposable, inorganometallic salts, e.g. a metal salt of a carboxylic or polycarboxylic acid as the source of the metal. Oxalates, formates, citrates and the like are typical of such salts. Oxalic acid is generally preferred. It is particularly advantageous to use the oxalate with silver because of its low decomposition temperature, balanced against its stability and relative ease of processing when appropriate precautions are taken to avoid premature decomposition. It is to be emphasized that use of silver oxalate requires stringent safely precautions because of its tendency to decompose violently. However, the powders produced by the process of the invention are entirely safe to handle in this respect.

In general, it is desirable that the organometallic salt formed for decomposition be the thermally decomposable salt of the metal (or mixture of metals) with an organic acid such that the decomposition of the salt takes place well below the boiling point of the acid but well above the melting point of the acid. This procedure allows the use of the atmospheric pressure and yet provides a low viscosity medium if the acid is itself chosen as the reaction medium.

There is substantial evidence that the organic reactant forms a compound with the metal. For example, infra-red analysis of the material strongly indicates that, even after extensive washing with tetrahydrofuran, a substantial quantity of aliphatic radical remains on the newly formed metal powder. This powder will have a particle size of about one micron or less. For some applications, particle sizes as large as 10 microns or more are acceptable. The preferred particles of the invention are less than one micron in average particle diameter. Indeed, it is particularly advantageous to produce excellent silver-powder compositions having nominal particle sizes in the range of from 0.02 to 0.5 micron average diameter or even lower. Without being bound by the theory, it is noted that the organic reactant is present on the metal particle in a quantity that is of the order of one monomolecular coating of the reactant. To illustrate this, a 0.05 micron silver powder has, suitably, from about 0.5% to 2% coating of the organic moiety of what is believed to be a silver oleate reaction product. In general, the non-conductive powder products formed according to the invention will contain metal-organo reaction product in a range of about from 0.05% to 10% by weight. It should be realized that this range is based on silver as the metal base. Moreover, it appears that the optimum amount of material required is about a monomolecular layer.

It should be noted that the precise chemical means by which a particular moiety, say an aliphatic hydrocarbon group, is attached to a metal is not believed to be important. Thus, if such a protective group is attached by a reaction of an aliphatic alpha amino acid with the metal or by use of other organic amines, and the like, the advantages of the present invention are substantially achieved.

The advantages of low-temperature operations in making so-called, thick films are very substantial. Use of lower temperatures, say only 250° C. above ambient, not only provides the advantage of using a lower maximum temperature, but greatly reduces the problems inherent in differential thermal expansion of the conductor film and its substrate. Thus, processing times, which can be reduced substantially simply because it is unnecessary to take the time to reach high temperatures, can often be further reduced because the absolute magnitude of potential differential thermal expansion is decreased to such an extent that the rate of heating can be increased.

It should be realized that small amounts of other metal powders may be incorporated in the protected silver powders of the invention to provide various modifications of the coating. Nickel powder, for example, may be added to silver in small amounts to modify its release properties, physical strength, appearance and other aspects of a film.

Moreover, it may be noted that small amounts of copper oxalate can be alloyed with the silver oxalate and will prevent its detonation. Bivalent copper atoms have the same Goldsmit radius as silver and can be substituted interchangeably in the silver oxalate lattice. Addition of 1% $CuSO_4$ to 99% $AgNO_3$, or even $\frac{1}{4}$% $CuSO_4$, in the solution, when added to oxalic acid, will make a mixed oxalate crystal. These crystals will not detonate on heating. Although not wishing to be bound by theory, the Applicants believe the Cu acts as a radical trap to prevent the detonation from propagating.

It should be noted that the oxalate is preferably dry, e.g. a state of dryness as can be achieved by washing with acetone or the like before reacting with the organic compound. Failure to dry will often result in a relatively coarse product and one that is conductive during the pre-fusing step. It has also been noted that the products produced with a non-dried material tend to have large metallic particle size. Thus, while such materials do tend to be a very substantial improvement of the prior art powders, in that they fuse at relatively low temperatures, and while such materials are believed to be of real commercial value, they are not as well protected by the organo material as are the products produced with a dry oxalate starting product.

ILLUSRTRATIVE EMBODIMENTS OF THE INVENTION

In this Application and accompanying drawings there is shown and described a preferred embodiment of the invention and suggested various alternatives and modifications thereof, but it is to be understood that these are not intended to be exhaustive and that other changes and modifications can be made within the scope of the invention. These suggestions herein are selected and included for purpose of illustration in order that others skilled in the art will more fully understand the invention and the principles thereof and will be able to modify it and embody it in a variety of forms, each as may be best suited in the condition of a particular case.

IN THE DRAWINGS

FIGS. 1 to 4 illustrate, schematically, the invention carried out on a glass-fiber reinforced polyimide substrate 10 on which is silk screened a thin (FIG. 1) coating of a paint bearing a silver powder which has been reacted with oleic acid, during the powders formation from the oxalate; and then incorporated into a binder resin (as is described elsewhere in this specification) to form a paint 12.

FIGS. 5–8 illustrate the formation of a paint useful in the process of FIGS. 1–4.

FIG. 9 is a schematic diagram of a novel helically-wound circuit-bearing device carrying a conductive pattern as described herein.

FIG. 2 illustrates the drying of the coating 12 to form a non-conductive grayish metallic-looking coating 14 (The coating is usually mirror-like, particularly when viewed through a glass substrate).

FIG. 3 illustrates the further heating at 210° C. to destroy the oleic barrier compound and allow a silver powder to come into particle-to-particle contact. Indeed, an excellent uniform metal surface of high conductivity is achieved.

Figure 10:
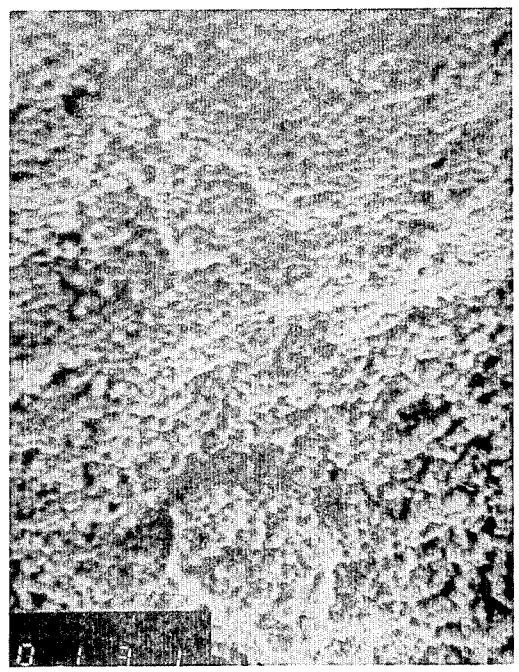
FIG. 10 is a photograph of a typical non-conductive powder form according to the invention and has a particle size of about 0.2 microns.

The preparation of a typical paint 12 is shown in FIGS. 5–8 wherein a metal oxalate 20, advantageously silver oxalate, or a mixed oxalate salt containing silver and another metal such as nickel is decomposed in, and reacted with, oleic acid 22 (FIG. 6) recovered as non-conductive metal powder particles 24 which have protective oleic groups bound thereto (FIG. 7) and then dispersed in a liquid vehicle 26 to provide a paint 12.

Figure 11:
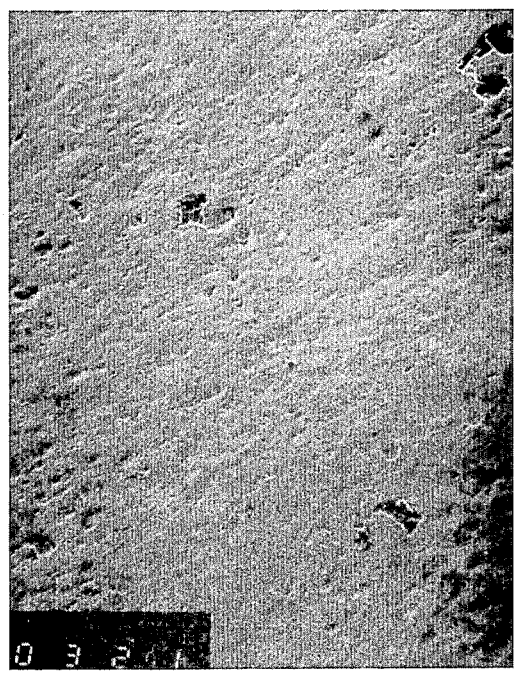
Figure 12:
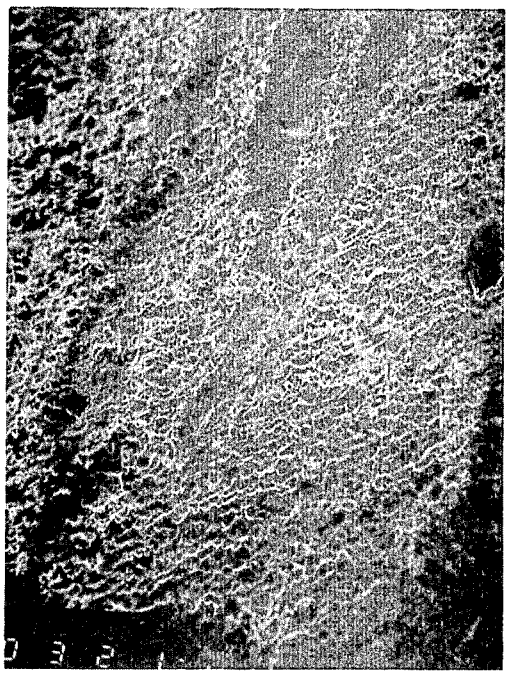
Figure 13:
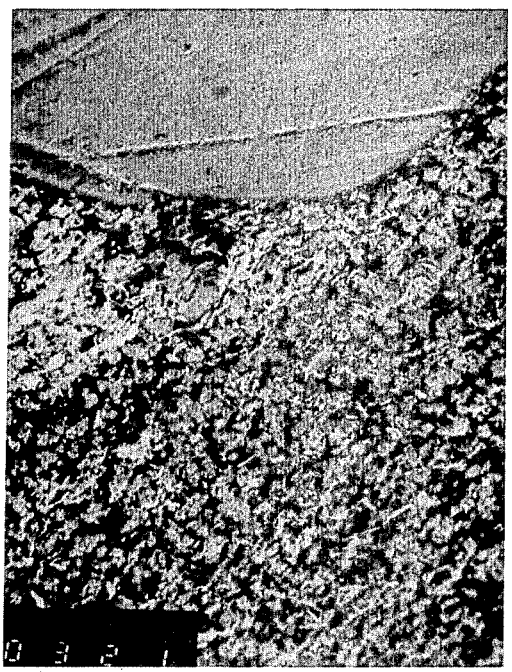

FIGS. 11, 12 and 13 show, respectively, a metal coating formed of a silver powder of the invention (i.e. FIG. 10); a silver coating is formed of both an existing commercial powder (intended to be fused well above 500° C.) in 50% admixture with the powder of the invention and a coating formed only with the commercial powder. These figures, as presented, are at about a 300x magnification. The commercial material is that available from Plessey Incorporated (EMD-Materials Division) and designated "LP80-4318".

The novel powder products are also useful when blended with coarser powder or powders having higher fusion points. In such cases they tend to lower substantially the fusion temperature of the resulting mixture or, if the temperature is maintained constant, facilitate the formation of a superior film of metal than could have been achieved without the use of the product of the invention. In such embodiments, it is desirable to use a range of about from 10% to 75% of the powders of the invention.

EXAMPLE I

Dissolve 170 grams of silver nitrate in a liter of deionized water.

Dissolve 140 grams of oxalic acid dihydrate in a liter of deionized water.

The nitrate solution is added to the oxalic acid solution slowly and with good agitation. Stirring is continued for about 30 minutes to assure precipitation of substantially all the reactant. Precipitate is recovered with a Buchner funnel using Number 50 Whatman filter paper and washed on the filter paper with 500 ml of deionized water, then 500 ml acetone to remove water and then dried.

Fifty grams of the dry precipitate is slurried in 500 grams of oleic acid. The mixture is stirred well on a hot plate in a fume hood and heated to 200° C. Note that carbon monoxide may be released during decomposition of the organo moiety and requires ventilation. Filter the mixture to remove the solid particles therefrom. These particles are believed to be of silver/silver-oleate composition. After the particles are washed with tetrahydrofuran to remove any excess oleic acid, 20 parts by weight of the material is formed into a paste with 20 parts by weight of a pine oil-ethyl cellulose binder sold under the trade designation 163-C by L. Reusche. This material is milled briefly in a three-roll mill during which time it assumes a shiny appearance. The composition thus prepared is ready for use in formation of conductive coatings and designs.

The composition is coated in a typical conductor pattern upon an alumina substrate of the type well known in the electronics industry used to support microelectronic circuitry. As coated, the material is non-conductive; it remains non-conductive as it is dried for 30 minutes at 100° C.; then the chip is heated to about 250° C. in air for 90 seconds. During this period the sample darkened slightly then, after about 60 seconds a silvery-white color predominates indicating the completion of fusion of the silver.

Resistance of the resulting material drops markedly during this "visible fusing" period, from about 6 ohms per square to about one ohm per square.

The silver coatings so formed exhibited excellent soldering characteristics:
1. It could be soldered without the use of flux under conditions where previously commercial materials require such flux.
2. Resistance to solder-leaching was excellent; the new conductive material could be maintained in the solder pot (60-40 tin-lead solder with about 2% silver added) for 20 seconds without losing the conductive silver patterns, whereas commercial material rapidly lost its silver, i.e. within a few seconds.
3. Good bonds to ceramic materials, e.g. 96% alumina chips such as those sold by Coors Co., can be achieved even without the use of the glass frits known to the art and by most prior thick film art.

Thus, it appears that the silver coating formed using the teachings of this invention are characterized by superior processing properties.

EXAMPLE II

A quantity of 100 grams of palmitic acid is melted and 10 grams of silver oxalate, prepared as described in Example I, is mixed into the salt. The resulting mixture is then heated above 160° C. In the range of 106° C. to 200° C. gas is evolved. After evolution of the gas, the material is cooled, on a sheet, into a film of friable solid. Thereupon the solidified material is broken into pieces and placed in 500 ml of tetrahydrofuran solvent. Non-reacted palmitic acid is dissolved by the solvent and removed by conventional filtering and washing procedures. The treated silver, with a coat of silver palmitate thereon, is extremely shiney when mixed, as described in Example I, with a coating vehicle. Coatings formed of the mixture are non-conductive until fused.

EXAMPLE III

The work described in Example II is repeated using stearic acid instead of palmitic acid. Similar results are achieved excepting only that the samples of product produced using palmitic acid usually have a shinier appearance and an attractive bluish luster than does the product of Example I.

EXAMPLE IV

The work of Example I is repeated excepting that one percent (on an atomic basis) of copper is substituted for one percent of silver in the oxalate salt. The salt, which is resistant to detonation, is processed to form an oleate-coated metal powder having substantially the same characteristics as the metal powder product of Example I.

EXAMPLE V

The above experiment was repeated using stearyl alcohol ($C_{18}H_{38}O$) as a substitute for palmitic acid.

Again, a non-conductive powder was formed which upon fusing at 250° C. was a highly conductive metal film. The film did not have the metallic appearance of the film described in Example I.

EXAMPLE VI

A non-conductive, oleic-acid treated, powder was prepared as described in Example I. A one mil polyimide film (of the type sold under the Trademark KAPTON by DuPont) was selected because of its excellent thermal stability. (In general, this experiment is repeated with any of the synthetic organic resins which have thermal stability for short periods above 400° F.).

A non-conductive paste formed of the oleic-acid treated silver powder was coated on the polyimide film in a printed conductor pattern. The film was then laid on a 250° C. surface for a period of about 30 seconds. An excellent conductor was formed on thermal conversion of the film to a metal as described in Example I. A particular advantage of the process of this Example is the new ability to form such a conductor pattern in a helically-wound polymer film, or any other such folded configuration permitted by the flexible substrate, e.g. cylinders, folded devices such as accordian shaped items and the like. Thereby markedly reducing the volume of the conductor itself. See, for example, FIG. 9 wherein a helically wound conductor element 30 bears an electrical circuitry 32.

EXAMPLE VII

FIGS. 11, 12, and 13 indicate how a product according to the invention (Example I) mixed with a commercial silver powder product intended to be sintered for a relatively long period at about 900°–925° C., allows much improved sintering at 400° C. (FIG. 12) over that achieved when the commercial powder product is sintered alone at 400° C. FIG. 11 shows the still improved coating achieved at 400° C. with the product of Example I.

It is also to be understood that the following claims are intended to cover all of the generic and specific features of the invention herein described and all statements of the scope of the invention which might be said to fall therebetween.

What is claimed is:

1. A process for making a conductive metal pattern on a non-conductive substrate comprising the steps of
   (1) forming a pattern, on said non-conductive substrate, of a coating comprising a non-conductive, fusible, metal-powder product; said fusible metal-powder product being formed by a chemical reaction of (a) a metal-powder substrate, with (b) hydrocarbon-chain-bearing reactants; and whereon said hydrocarbon chains are chemically bonded to said metal powder substrate to form a non-conductive barrier layer chemically reacted to said metal; and
   (2) thermally decomposing said barrier material and causing said non-conductive metal powder product to fuse into said conductive coating.

2. A process as defined in claim 1 wherein said reactant is a carboxylic acid having at least 8 carbon atoms and said metal is silver.

3. A process as defined in claim 2 wherein said decomposition is carried out below 250° C.

4. A process as defined in claim 1 wherein said decomposition is carried out in a gas comprising a major portion of oxygen.

5. A process as defined in claims 1, 2, 3 or 4 wherein said fusible coating is formed of fusible powder of less than 1 micron in average diameter.

6. A process as defined in any of claims 1, 2, 3 or 4 wherein said non-conductive substrate is a ceramic substrate or an organic resin substrate.

7. A process as defined in claims 1, 2, 3 or 4 wherein said non-conductive barrier layer is resistant to removal from said metal by hydrofurane.

8. A process as defined in claims 1, 2, 3 or 4 wherein said non-conductive barrier layer is resistant to removal from said metal by hydrofuran and wherein said fusible coating comprises a fusible powder of less than 1 micron in average diameter.

9. A process as defined in claims 1, 2, 3 or 4 wherein said non-conductive metal powder has an average diameter of from 0.05 to 0.50 microns; has a monomolecular coating of said non-conductive barrier layer which is resistant to removal with hydrofuran, said barrier layer comprised of hydrocarbon chains of up to about 24 carbon atoms.

* * * * *

UNITED STATES PATENT AND TRADEMARK OFFICE
CERTIFICATE OF CORRECTION

PATENT NO. : 4,333,966
DATED : June 8, 1982
INVENTOR(S) : Deffeyes et al.

It is certified that error appears in the above-identified patent and that said Letters Patent are hereby corrected as shown below:

Column 6, line 24, delete "salt" and insert --melt--.

Signed and Sealed this

Twenty-fourth Day of August 1982

[SEAL]

Attest:

GERALD J. MOSSINGHOFF

Attesting Officer    Commissioner of Patents and Trademarks